(12) United States Patent
Lu et al.

(10) Patent No.: US 8,178,429 B1
(45) Date of Patent: May 15, 2012

(54) NANOFABRICATION USING DIP PEN NANOLITHOGRAPHY AND METAL OXIDE CHEMICAL VAPOR DEPOSITION

(75) Inventors: Ryan P. Lu, Carlsbad, CA (US); Ayax D. Ramirez, Chula Vista, CA (US); Stephen D. Russell, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 417 days.

(21) Appl. No.: 12/569,530

(22) Filed: Sep. 29, 2009

(51) Int. Cl.
*H01L 21/20* (2006.01)

(52) U.S. Cl. .. 438/496; 427/256; 427/457; 257/E21.536

(58) Field of Classification Search .................. 438/496; 427/256, 457; 257/E21.536
See application file for complete search history.

(56) References Cited

U.S. PATENT DOCUMENTS

| | | | |
|---|---|---|---|
| 7,541,062 B2 * | 6/2009 | Sheehan et al. | 427/256 |
| 7,597,717 B1 * | 10/2009 | Lu et al. | 850/22 |
| 2005/0191434 A1 * | 9/2005 | Mirkin et al. | 427/457 |
| 2006/0052947 A1 | 3/2006 | Hu | |
| 2007/0059645 A1 | 3/2007 | Tang et al. | |
| 2009/0026543 A1 | 1/2009 | Yang | |

OTHER PUBLICATIONS

Jagar, et al., "A FinFET and Tri-Gate MOSFET's channel structure patterning and its influence on the device performance" Thin Solid Films, (2004), 462-463.
Piner, R.D., et al., "Dip-pen nanolithography", Science, 283, (1999), 661-663.
Wang, Y., et al., "Epitaxial Growth of Silicon Nanowires using an Aluminum Catalyst", Nature Nanotechnology, Nov. 26, 2006.

* cited by examiner

*Primary Examiner* — Colleen Matthews
(74) *Attorney, Agent, or Firm* — Kyle Eppele; Peter A. Lipovsky

(57) ABSTRACT

Fabrication of a semiconductor structure is achieved by using a Dip Pen Nanolithography (DPN) tip to apply a metal catalyst to a prepared substrate. The catalyst is applied in a predetermined pattern, and crystal growth is established at the catalyst site.

12 Claims, 3 Drawing Sheets

NANOFABRICATION USING DIP PEN NANOLITHOGRAPHY AND METAL OXIDE CHEMICAL VAPOR DEPOSITION

FEDERALLY-SPONSORED RESEARCH AND DEVELOPMENT

This invention (Navy Case No. 098639) is the product of U.S. Government funding. Commercial licensing inquiries may be directed to Office of Research and Technical Applications, Space and Naval Warfare Systems Center, Pacific, Code 72120, San Diego, Calif., 92152, 'telephone (619)553-2778; email: T2@spawar.navy.mil.

BACKGROUND

This subject matter relates to semiconductor fabrication using Dip Pen Nanolithography (DPN).

To satisfy Moore's Law, the semiconductor industry must double the number of transistors on a chip every 2 years. This is proving to be more challenging as the feature size of the transistors decrease to meet power requirements. Various techniques are used to reduce feature size and increase the density of components of manufactured semiconductor devices.

SUMMARY

A semiconductor structure is fabricated by Dip Pen Nanolithography (DPN) and circuitry is formed in accordance with patterns formed by the DPN. A substrate suitable for semiconductor manufacture is prepared. A DPN tip is used to apply a metal catalyst to the substrate in a predetermined pattern. The pattern is then used for crystallizing silicon at the catalyst site on the substrate.

DETAILED DESCRIPTION

Overview

Figure 1A:
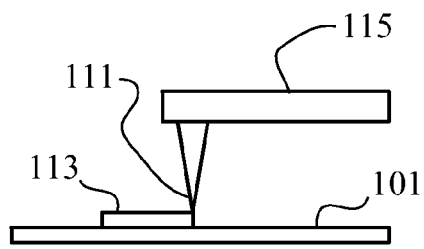
FIGS. 1A-1H are a series of schematic diagrams showing fabrication steps used to produce a semiconductor device.
Figure 1E:
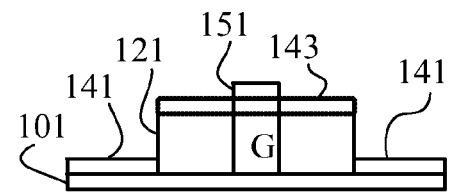

Intel's® Tri-gate and the FinFET by AMD®, IBM®, and Motorola® are new technologies that have been developed to extend Moore's law into the future years. Currently this technology depends on expensive equipment to perform extreme ultra-violet photolithography (EUV) in order to fabricate feature sizes below 65 nm and may result in lower yields.

Dip Pen Nanolithography (DPN) is a technique recently developed where an atomic force microscope (AFM) is used to transfer molecules to a surface via capillary action or a solvent meniscus. Depending on the velocity of the AFM tip, line widths as narrow as 15 nm can be drawn. A 55,000 tip cantilever was recently developed to draw identical patterns in parallel. The spacing between two drawn features can be as little as 5 nm leading to an extremely high density integrated circuit chip. Providing such narrow line widths is currently not possible with the current state-of-the-art fabrication process used in industry.

The Metal Organic Chemical Vapor Deposition (MOCVD) method is used to grow materials epitaxially from the surface reaction of organic compounds or metal organics and metal hydrides. This method is generally used to fabricate silicon nanowires. In the literature, growth of silicon nanowires required gold to act as a metallic catalyst to facilitate the single crystal growth. Unfortunately, gold is detrimental to electronic device performance since it forms mid-bandgap states, resulting in the gold acting as a deep level trap (electron trap). This inhibits device operation and therefore is an incompatible material for complementary metal oxide semiconductor (CMOS) processing. Recently, a group at the Max Planck Institute demonstrated that similar growth results can be achieved with aluminum, which is a CMOS compatible metal.

One type of multigate transistor is called a "FinFET". A particular characteristic of a FinFET transistor is a thin silicon structure, called a "fin" which is formed on a Silicon on Insulator (SOI) substrate. The thin silicon "fin" forms the body of the device. Typically, "FinFET" is used to describe non-planar double-gate transistors and tri-gate transistors; however the present techniques are not limited to such structures. Similarly, Gate All Around (GAA) FETs use nanostructures and nanowires as part of their basic structure.

This disclosure relates to nanofabrication techniques used to form, for example, multigate transistors using a thin silicon "fin" structure (FinFET transistors). The technique includes the use of Dip Pen Nanolithography (DPN) to deposit metallic catalysts, followed by Metal Organic Chemical Vapor Deposition (MOCVD) of the semiconductor species to grow single fin structures used in the formation of the FinFET transistors.

The described technique, in the most general configuration, is to utilize the combination of DPN and MOCVD to form active electronic devices with multiple terminals such as transistors and diodes. In particular, this technique pertains to a novel method for forming FinFETs or tri-gate transistors using DPN and MOCVD. A feature of the technique is exploiting the direct transfer of a metal catalyst on the silicon substrate using the DPN technique followed by growth of single crystalline silicon beneath the metal catalyst using MOCVD. Subsequent processing may be used to deposit the gate electrode and to define the source and drain regions via ion implantation. In an example configuration, a silicon or silicon-on-insulator substrate is placed on a wafer chuck in an Atomic Force Microscope (AFM) capable of performing DPN. The DPN system will utilize one or more cantilevers (where a cantilever may contain one or more tips). The tips are then dipped into a solution containing the metal catalyst. The tips are then moved to a desired location and deposit the metal catalyst solution via a meniscus formed between the tip(s) and the substrate surface. The substrate is then transferred into a MOCVD system where silane, dichlorosilane, or another precursor gas containing silicon is directed onto the substrate surface. The silicon from the precursor gas (in this example silane) is then dissolved by the metal catalyst (aluminum) and when the catalyst cannot absorb anymore silicon, the silicon crystallizes out beneath the catalyst.

This process continues perpendicular to the sample surface, until the desired structure height is obtained and the flow of the silicon precursor gas is shut off. A mask, such as silicon nitride (SiN), is then deposited and the metal catalyst is then removed via etching. The gate metal can be deposited by DPN or conventional UV photolithography. At this point the source/drain is the only region exposed and can be doped n-type or p-type via ion implantation, or using gas immersion laser doping, for example. Dopant activation can occur via conventional thermal annealing, rapid thermal annealing or laser annealing, for example. Contact metallization can occur via DPN or conventional UV photolithography, for example.

Integrated circuits applying this method can benefit from combining FinFETs of various heights. Specifically, taller FinFETs can carry more current, while shorter FinFETs can be used for low-power circuitry and reduced leakage currents. Additionally, this method is compatible with current multilayer stacking technology (i.e., low-k dielectrics and chemical mechanical polishing techniques) currently applied in the industry.

Configurations of the Devices

Figure 1B:
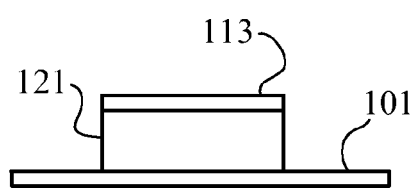
Figure 1F:
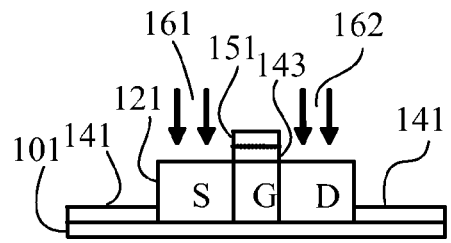
Figure 1C:
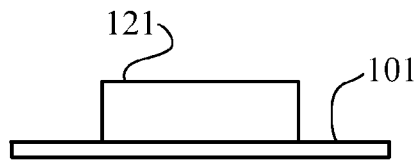
Figure 1G:
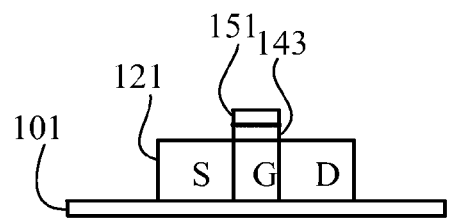
Figure 1D:
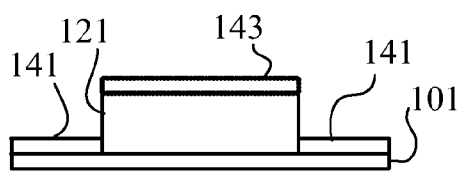
Figure 1H:
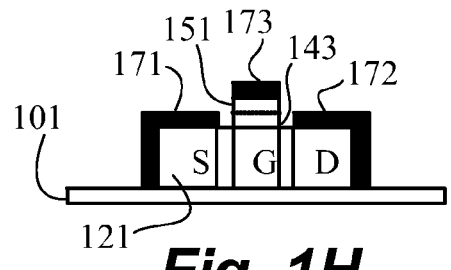

FIGS. 1A-1H are a series of schematic diagrams showing fabrication steps used to produce an example semiconductor device. These figures schematically show a cross-section of the disclosed technique, depicting
  a) deposition of metal catalyst using the DPN technique (FIG. 1A);
  b) growth of single crystal silicon structures using MOCVD (FIG. 1B);
  c) removal of metal catalyst via etching (a field dielectric may be grown or deposited prior to this step if necessary to isolate the devices) (FIG. 1C);
  d) growth or deposition of the gate dielectric (FIG. 1D);
  e) deposition and patterning of gate metal (FIG. 1E);
  f) removal of the exposed gate dielectric and doping and annealing of the source and drain regions (FIG. 1F);
  g) removal of the field dielectric mask layer (FIG. 1G); and
  h) deposition and patterning of contact metallization (FIG. 1H).

In FIG. 1A, a substrate 101 is prepared. An example of wafer preparation is standard RCA cleaning which typically comprises organic cleaning, HF oxide strip and ion cleaning, followed by washing with deionized water. The preparation of the substrate 101 is followed by using a DPN tip 111 to deposit metal catalyst 113 onto the substrate 101. DPN tip 111 is an atomic force microscope tip and is used to transfer the metal catalyst 113 as a meniscus. DPN tip 111 is mounted to cantilever 115 and may be part of a multiple tip cantilever. Likewise multiple cantilevers can be used to replicate the pattern at different locations on the substrate 101.

The substrate may be any suitable semiconductor substrate, such as a silicon wafer, ceramic or glass used for silicon-on-insulator fabrication. The substrate may be a different type of semiconductor or dielectric material.

In FIG. 1B, a single crystal 121 is grown beneath metal catalyst 113 on substrate 101. This is achieved by using a semiconductor precursor. In the case of silicon, non-limiting examples of a semiconductor precursor include silane, dichlorosilane, or another precursor gas containing silicon. This may be achieved by MOCVD or another suitable technique capable of causing growth of the crystal structure beneath the metal catalyst. It is also possible to form the material in polycrystalline structure or amorphous structure.

In FIG. 1C, metal catalyst 113 is stripped, leaving crystal 121 on substrate 101.

In FIG. 1D, field dielectric mask layer 141, 143 is deposited or formed over the substrate 101 (dielectric 141) and over crystalline structure 121 (dielectric 143). After forming of dielectric layer, gate structure 151 is formed adjacent crystalline structure 121, shown in FIG. 1E. The gate structure may be formed as a metallization layer.

In FIG. 1F, the exposed gate dielectric is removed and source/drain regions 161, 162, respectively, are defined by selectively stripping dielectric layer 141 and by adding minority carrier impurities. The impurities may be added by suitable means such as implant or diffusion.

In FIG. 1G field dielectric mask layer 141 is removed.

In FIG. 1H, contact metallization 171, 172, 173 is deposited.

Figure 2:
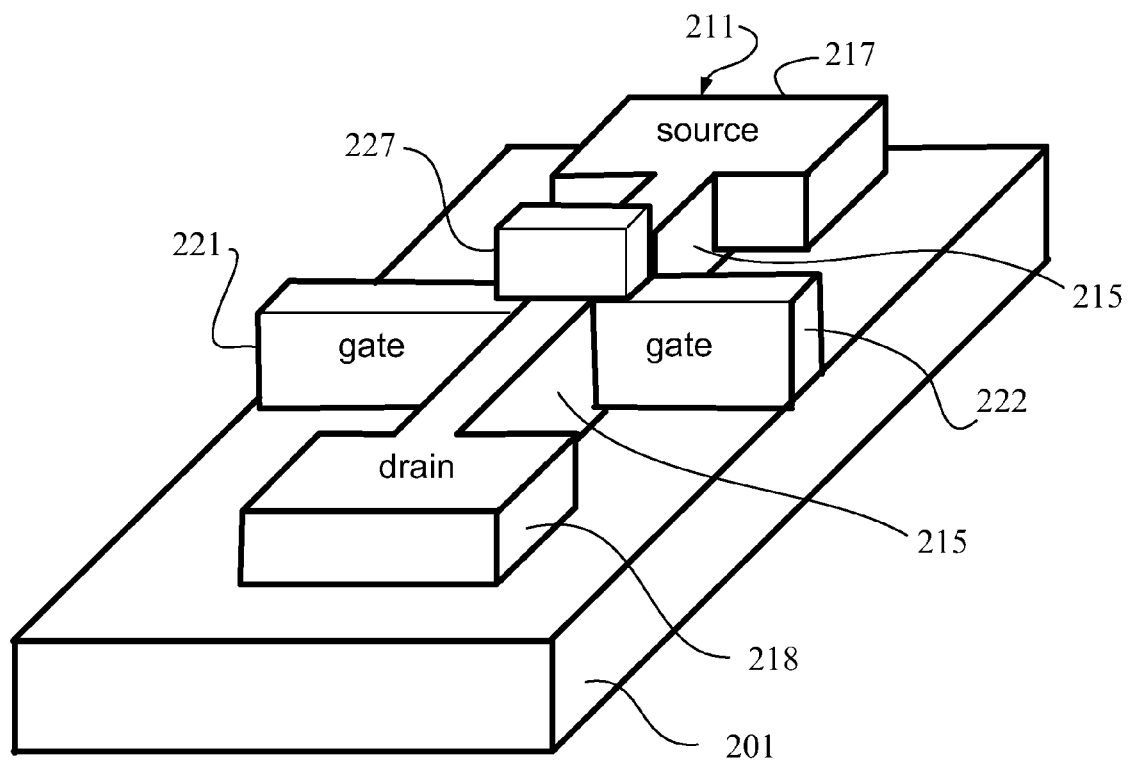
FIG. 2 is a diagram showing a schematic view of a double gate FinFET device.

FIG. 2 is a diagram showing a schematic view of a double gate FinFET formed using the above technique. Depicted are substrate 201, a fin structure 211 which includes a narrow area 215 and source drain areas 217, 218, respectively. Also depicted are gate structures 221, 222 and a contact and interconnect structure 227.

Figure 3:
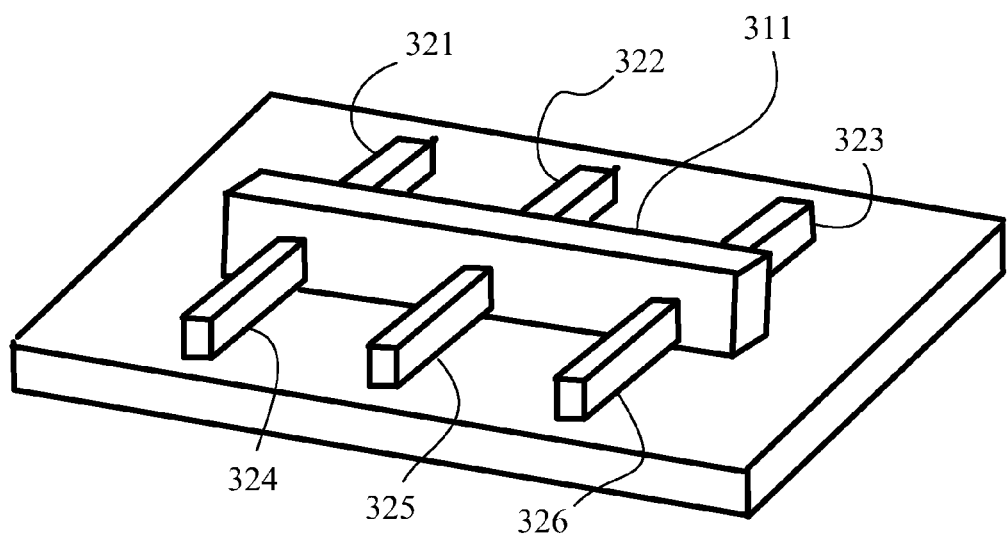
FIG. 3 is a diagram showing a schematic view of a FinFET formed with multiple sources or drains.

FIG. 3 is a diagram showing a schematic view of a FinFET formed having fin structure 311, with multiple sources or drains using the described technique. Separate sources 321, 322, 323 and drains 324, 325, 326 are provided. The fin structure 311 provides a gate function. The structures have drawn line widths below 25 nm and spacing between drawn line widths below 10 nm. Provided that a DPN cantilever is configured with a suitable number of tips, more than 100,000 identical parallel structures can be drawn using these dimensions.

Figure 4:
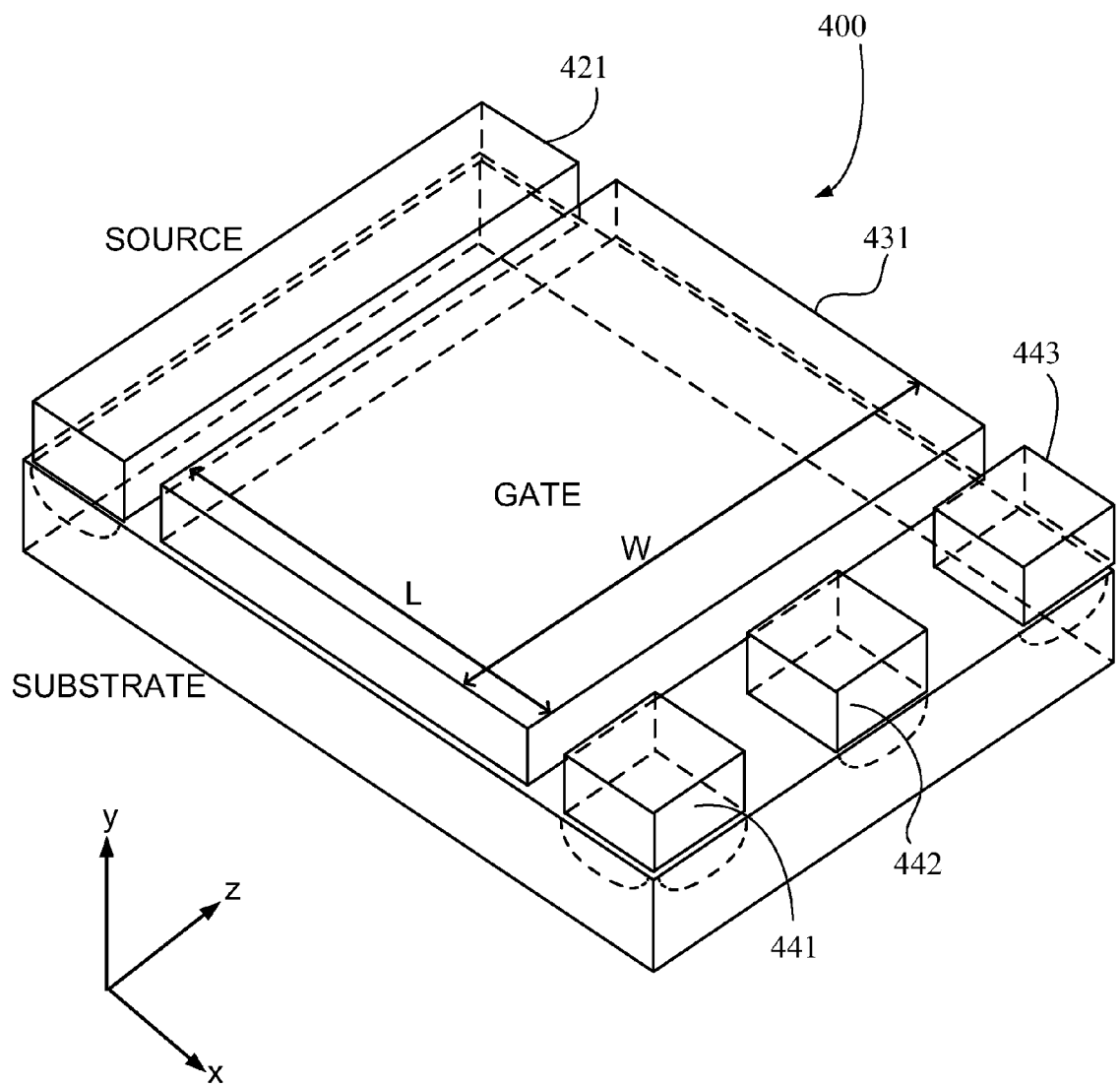
FIG. 4 is perspective view of a triple-gate (tri-gate) MAG-FET device.

The FinFET is one example where DPN-MOCVD is applied to form single or multiple device components; however the technique can be used for fabricating a variety of semiconductor structures. FIG. 4 is perspective view of a triple-gate (Tri-gate) MAGFET 400 which may be produced using the described techniques. This is an example of the techniques used to form multiple drain contacts that are closely spaced, as shown. MAGFET 400 is a field-effect transistor having source region 421, gate region 431 which contains the three gates, and a plurality of drains 441, 442, 443 corresponding to the gates in gate region 431. The difference in the drain currents can be affected by the presence of an external magnetic field, and therefore allow the MAGFET to be used as a magnetic sensor.

In a simpler example of a dual-drain MAGFET, if no magnetic field is applied and the bias voltage at the drains are the same, the device behaves exactly like a MOSFET; however, if a magnetic field is present the carriers in the channel are deflected as a result of the Lorentz force $$F = q \cdot v \times B$$

where F denotes the Lorentz force, q is the charge of the carriers, v is the carrier velocity, and B is the magnetic field.

This charge deflection, essentially the Hall Effect, results in a perturbed balance of the current flow in the channel area and thus in different currents $$I_{D1} = \tfrac{1}{2} + \Delta I \text{ and } I_{D2} = \tfrac{1}{2} - \Delta I,$$

measured at the two drains.

The relative sensitivity ($S_r$) of the MAGFET equals $$\Delta I / I \cdot B$$

where the total current $I = I_{D1} + I_{D2}$
and where $I_{D1}$ and $I_{D2}$ are the currents at the respective drains Therefore the sensitivity is a function of several geometric parameters, such as the distance between the two drains, the channel length, the width of the source contact, the gate overlap as well as the gate and drain voltages. The nanofabrication methods of the present disclosure allow one to control small dimensions of the MAGFET and optimize sensitivity of the device.

In the case of a three-drain MAGFET, the central drain current is typically used as a reference, and a differential current is sensed on the lateral drains. The fabrication of this device using the nanofabrication process described above, provides for increased sensitivity similar to the two-drain MAGFET, but also may be used to sense minute spatial variations or non-uniformity in the magnetic field. The DPN-MOCVD fabrication process may be extended to any-plurality of drains, for example, high sensitivity magnetic sensing applications.

Differences

This technique provides a quick, simple and cost-effective method for fabricating FinFET transistors using a combination of DPN and MOCVD techniques. The process makes it feasible to provide more efficient manufacture than what is currently possible with the current state-of-the-art fabrication processes used in industry.

Alternatives

This technique may be applied to any materials system, including group IV semiconductors, compound semiconductors such as group III-V and group II-VI semiconductors and other ternery and quaternary semiconductor compounds or alloys. This technique also applies to various direct writing lithography techniques such as fountain pen nanolithography where the "ink" source is continuously supplied to the writing tip. This provides a technique for fabrication of a single gate and single source/drain transistor; however, the technique also pertains to multi-gate and multi-drain/source structures. The term "structures" pertains not only to transistors, but also to other active and passive devices such as diodes, with applications to sensors, detectors and impedance elements, for example.

Conclusion

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. A method for fabricating a semiconductor structure, the method comprising:
   preparing a substrate;
   using a Dip Pen Nanolithography (DPN) tip to apply a metal catalyst to the substrate in a predetermined pattern; and
   crystallizing silicon at the catalyst site on the substrate.

2. The method of claim 1, wherein the step of crystallizing is accomplished using Metal Organic Chemical Vapor Deposition (MOCVD).

3. The method of claim 2, further comprising depositing a gate electrode and defining source and drain regions via ion implantation.

4. The method of claim 1, further comprising:
   placing a silicon or a silicon-on-insulator, as the substrate, on a wafer chuck in an Atomic Force Microscope (AFM) capable of performing the DPN by using one or more cantilevers, each cantilever comprising one or more tips;
   dipping the tips into a solution containing the metal catalyst;
   moving the tips to a desired location for deposition of the metal catalyst onto the substrate via a meniscus formed between the tips and a surface of the substrate;
   after deposition, transferring the substrate to a Metal Organic Chemical Vapor Deposition (MOCVD) chamber;
   within the MOCVD chamber, directing flow of a precursor gas containing silicon onto the substrate surface, thereby causing the metal catalyst to dissolve the silicon from the precursor gas to a point of saturation with the metal catalyst; and
   crystallizing the dissolved silicon from beneath the catalyst as a result of the saturation of the metal catalyst.

5. The method of claim 4 within the precursor gas comprises a gas taken from the group comprising silane and dichlorosilane.

6. The method of claim 4, further comprising:
   continuing the crystallizing of the dissolved silicon in a direction perpendicular to the substrate surface, until obtaining a predetermined structure height;
   after obtaining the predetermined structure height, terminating the flow of the precursor gas;
   depositing a mask onto the substrate and crystallized structure; and
   selectively removing the metal catalyst by etching.

7. The method of claim 6, further comprising:
   defining a gate region within the crystallized structure;
   forming source and drain regions within at least a portion of the gate region via ion implantation; and
   applying contact metallization.

8. The method of claim 6, further comprising:
   forming a gate region adjacent the crystallized structure;
   forming source and drain regions within at least a portion of the gate region by use of ion implantation; and
   applying contact metallization.

9. The method of claim 1, further comprising:
   crystallizing silicon by growing a single crystal silicon structure;
   forming a field dielectric to define etch areas over the substrate;
   removing the metal catalyst by etching past the field dielectric, thereby exposing the crystallized silicon;
   forming a gate dielectric over at least one of the substrate or material formed on the substrate;
   forming gate connections over the gate dielectric;
   doping and annealing to form source/drain regions; and
   forming contact metallization.

10. The method of claim 1, further comprising:
    after the step of crystallizing the silicon, growing single crystal silicon structures using Metal Organic Chemical Vapor Deposition (MOCVD);
    forming a field dielectric mask area and forming a field dielectric to define etch areas;
    removing the metal catalyst by etching past the field dielectric;
    forming a gate dielectric;
    forming gate connections;
    doping and annealing of source/drain regions;
    removing the field dielectric mask layer; and
    forming contact metallization.

11. A semiconductor circuit formed by the method of claim 1, formed as a FinFET device having at least a double gate, and further comprising,
    a raised fin structure formed by the DPN lithography and the crystal growth at the DPN site; and
    a further structure juxtaposed to the raised fin structure, and implanted with at least one minority carrier.

12. The semiconductor circuit of claim 11, wherein the raised fin structure has a line width below 25 nm and a spacing between at least two adjacent raised fin structures below 10 nm.

* * * * *